United States Patent
Gao

(10) Patent No.: US 10,912,229 B1
(45) Date of Patent: Feb. 2, 2021

(54) COOLING SYSTEM FOR HIGH DENSITY RACKS WITH MULTI-FUNCTION HEAT EXCHANGERS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/542,159

(22) Filed: Aug. 15, 2019

(51) Int. Cl.
H05K 7/20 (2006.01)

(52) U.S. Cl.
CPC ..... H05K 7/20827 (2013.01); H05K 7/20745 (2013.01); H05K 7/20836 (2013.01); H05K 7/20172 (2013.01); H05K 7/20309 (2013.01); H05K 7/20318 (2013.01); H05K 7/20327 (2013.01); H05K 7/20381 (2013.01)

(58) Field of Classification Search
CPC .......... H05K 7/20827; H05K 7/20745; H05K 7/20836; H05K 7/20172; H05K 7/20309; H05K 7/20318; H05K 7/20327; H05K 7/20381; H05K 7/20781; H05K 7/20736; H05K 7/2079; H05K 7/20772; H05K 7/1485; H05K 7/1487; H05K 7/1497; H05K 7/20145; H05K 7/20709; H05K 7/20727; H05K 7/208; H05K 7/20818; H01L 23/473; F25B 2339/041; F25D 16/00; F28D 15/00; F28D 15/0266; G06F 1/20; G06F 1/206; G06F 2200/201
See application file for complete search history.

(56) References Cited

U.S. PATENT DOCUMENTS

| | | | | |
|---|---|---|---|---|
| 4,313,310 A * | 2/1982 | Kobayashi | ................ | F24F 1/00 62/175 |
| 7,508,666 B1 * | 3/2009 | Henneberg | ......... | H05K 7/20745 165/80.4 |
| 8,184,435 B2 * | 5/2012 | Bean, Jr. | ............ | H05K 7/20745 361/696 |
| 9,723,762 B1 * | 8/2017 | Ross | .................. | H05K 7/20745 |
| 10,238,011 B1 * | 3/2019 | Cui | .................... | H05K 7/20781 |
| 2004/0221604 A1 * | 11/2004 | Ota | .................... | H05K 7/20781 62/259.2 |

(Continued)

Primary Examiner — Binh B Tran
Assistant Examiner — Michael A Matey
(74) Attorney, Agent, or Firm — Womble Bond Dickinson (US) LLP

(57) ABSTRACT

A cooling system and a multi-function heat exchanger design for electronics racks has one or more liquid-to-liquid heat exchangers (or their functions) and one or more liquid-to-air heat exchangers (or their functions). Each liquid-to-liquid heat exchanger has a rack-liquid channel, and an external-liquid channel, the rack-liquid channel and the external-liquid channel being fluidly isolated from each other, and thermally coupled to each other to transfer thermal energy between rack-liquid that circulates through the rack-liquid channel and external-liquid that circulates through the external-liquid channel. The one or more liquid-to-air heat exchangers each have an air path that circulates air between the electronics racks and ambient space around the electronics racks, the air path being thermally coupled to an external-liquid channel of the liquid-to-air heat exchanger to transfer thermal energy between the air and the external-liquid.

20 Claims, 7 Drawing Sheets

(56) References Cited

U.S. PATENT DOCUMENTS

| | | | |
|---|---|---|---|
| 2009/0268404 A1* | 10/2009 | Chu | H05K 7/20745 361/696 |
| 2011/0029152 A1* | 2/2011 | Patel | H05K 7/20836 700/300 |
| 2012/0026691 A1* | 2/2012 | Campbell | H05K 7/20781 361/700 |
| 2012/0111038 A1* | 5/2012 | Campbell | F25B 39/02 62/115 |
| 2012/0218711 A1* | 8/2012 | Kashirajima | H05K 7/20827 361/700 |
| 2012/0300398 A1* | 11/2012 | Eckberg | H05K 7/20718 361/692 |
| 2013/0021746 A1* | 1/2013 | Campbell | H05K 7/20145 361/679.47 |
| 2014/0321050 A1* | 10/2014 | Sato | G06F 1/20 361/679.47 |
| 2015/0048950 A1* | 2/2015 | Zeighami | H05K 7/20781 340/605 |
| 2015/0345846 A1* | 12/2015 | Kopko | F25B 40/04 62/115 |
| 2016/0174417 A1* | 6/2016 | Hachiya | H05K 7/20836 62/115 |
| 2017/0013746 A1* | 1/2017 | Campbell | H05K 7/20781 |
| 2017/0105317 A1* | 4/2017 | Heydari | H05K 7/20736 |
| 2017/0231118 A1* | 8/2017 | Cader | G06F 1/20 |
| 2018/0042140 A1* | 2/2018 | Pan | H05K 7/20736 |
| 2018/0324976 A1* | 11/2018 | Gao | H05K 7/20836 |
| 2019/0179384 A1* | 6/2019 | Sato | G06F 1/20 |
| 2019/0254198 A1* | 8/2019 | Magallanes | H05K 7/20309 |
| 2019/0335623 A1* | 10/2019 | Gao | H05K 7/20745 |
| 2020/0253089 A1* | 8/2020 | Gao | H05K 7/20836 |

\* cited by examiner

COOLING SYSTEM FOR HIGH DENSITY RACKS WITH MULTI-FUNCTION HEAT EXCHANGERS

TECHNICAL FIELD

Embodiments of the present disclosure relate generally to a cooling system for an electronics rack. More particularly, embodiments of the disclosure relate to a cooling system having multi-functioning heat exchangers.

BACKGROUND

Data centers are mission critical facilities that house a large number of servers and IT equipment. Cooling systems provide a proper thermal environment for the IT equipment. It is critical to design a cooling system that can ensure the IT equipment can operate over all possible conditions, especially under peak power condition.

In legacy data centers, e.g., those developed in the past two decades, the rack power density is relativity low (e.g., 2 kW to 4 kW). Cooling systems for such racks can be designed with fewer problems as compared to higher power density (and higher heat load) applications. For example, a cooling unit such as heat exchanger can be small under low power density conditions and fit within a typical IT electronics rack. Rack power density, however, is increasing. For example, server power density (the power output of a server) is increasing with new server components that provide more powerful computing services. Further, the numbers of servers that are populated in a single rack is also increasing. Thus, IT equipment has seen a dramatic increase in rack power density. Thermal management of the rack becomes a challenge.

When the rack density is increased significantly, such as 20 kW-30 kW, the cooling system design and the corresponding key factors for planning and designing the thermal management solution are completely different from legacy data centers. In addition, some of the IT equipment housed in a rack is air-cooled while other IT equipment in the same rack is liquid-cooled.

There are many mature cooling solutions that exist for data enters and electronics racks, but most solutions are designed for low power density thermal management. The traditional air cooling solution is generally insufficient in meeting air flow requirements of higher power density racks. In addition, with a significant increase of air flow, which can be measured as cubic feet per minute, or CFM, operating costs such as energy consumed to operate a fan, and capital costs such as expensive air moving equipment, can increase dramatically.

Further, liquid cooling solutions, including both rack level liquid cooling solution and a server level liquid cooling solution, have been proved as feasible solutions for high density racks. These solutions generally consist of two heat transfer loops in the infrastructure, one is the external loop, and other one is internal loop. The external cooling loop can have an external cooling unit such as a cooling tower and an external cooling distribution unit (CDU). The internal loop (a rack cooling loop) can include an internal CDU and 1) a cooling unit such as RDHX, INrow cooler, or overhead cooling unit; and 2) a server liquid cooling device, including fluid distribution manifold and cold plate. A shortfall of such a solution (and similar solutions) is that the system still requires air cooling infrastructure—the air in the IT environment (e.g., data center air) can get very hot, since the server and IT equipment is partially liquid cooled and partially air cooled.

Air cooling solutions can have designs suitable for lower power densities, but not for higher power densities. A liquid-to-air heat exchanger/coil can be located on the top of rack. The rack is arranged to contain the hot air in a containment area. Chilled water is supplied to the heat exchanger on the top of the rack and the heat exchanger is used for cooling the hot air. The hot air leaves the back of the rack, rises up, and is cooled after passing through the heat exchanger and is supplied to the cold aisle (or ambient air) in front of the rack. This solution, however, accounts for air cooling data center for lower power densities, but not liquid cooled equipment that have higher power densities.

BRIEF DESCRIPTION OF THE DRAWINGS

Embodiments of the invention are illustrated by way of example and not limited in the figures of the accompanying drawings in which like references indicate similar elements.

DETAILED DESCRIPTION

Figure 1:
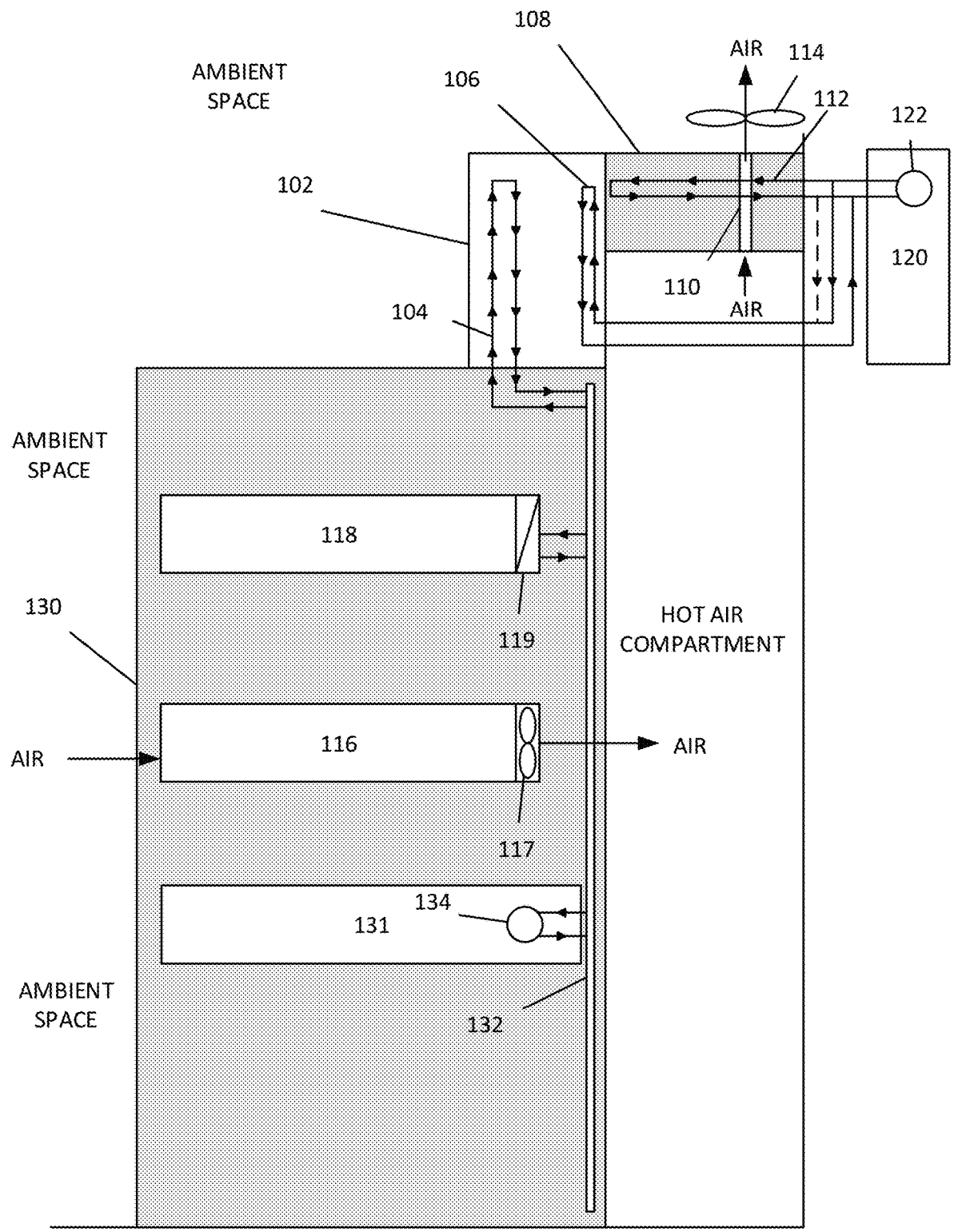
FIG. 1 shows a cooling system for electronics rack, according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" or "in one aspect" in various places in the specification do not necessarily all refer to the same embodiment or aspect.

Embodiments of the present disclosure address problems of existing cooling solutions, for example, those mentioned above. A cooling system design for high power density racks should be compatible with not only the rack power density (which can be understood as the heat load), but also with a variety of cooling requirements and rack cooling configurations as well.

Embodiments of the present disclosure provide a system solution for high density racks using hybrid cooling solutions (e.g., liquid-to-liquid and liquid-to-air heat exchangers). Multi-function heat exchangers in a single system are introduced for cooling high power density racks. Features of the present disclosure also address cooling requirements of components or racks that require both air and liquid cooling.

According to one embodiment, a cooling system for electronics racks includes one or more liquid-to-liquid heat exchangers. Each has a rack-liquid channel, and an external-liquid channel, the rack-liquid channel and the external-liquid channel being a) fluidly isolated from each other, and b) thermally coupled to each other to transfer thermal energy between rack-liquid (of the electronics rack that the corresponding rack-liquid channel is connected to) that circulates through the rack-liquid channel and external-liquid that circulates through the external-liquid channel.

The cooling system also includes one or more liquid-to-air heat exchangers, each having an air path that circulates air between the electronics racks and ambient space around the electronics racks, the air path being thermally coupled to an external-liquid channel of the liquid-to-air heat exchanger to transfer thermal energy between the air and the external-liquid.

Each of the external-liquid channels of the liquid-to-liquid heat exchangers or the liquid-to-air heat exchangers can connect to an external cooling unit that circulates the external-liquid through each of the external-liquid channels.

It should be understood that an 'air path' or 'liquid channel' can be a conduit such as a pipe having a variety of dimensions and shapes (e.g., coil, zig-zag, etc.). The channels can be implemented or manufactured with different known means (e.g., with pipes, hollowing of solid plates, molds, etc.). A 'channel' and 'path' is can be described as a loop that recirculates coolant (e.g., a liquid or vapor), air, or other fluid.

In one embodiment, a cooling system is shown in FIG. 1 for an electronics rack 130 that houses one or more servers 118 and 116. In this example, server 118 is liquid-cooled and server 116 is air-cooled. A liquid-to-liquid heat exchanger 102 has a rack-liquid channel 104 that connects to a rack-liquid loop of the electronics rack which can use a manifold to distribute coolant to and from the heat exchanger and the components housed in the rack. The rack-liquid can be temperature controlled and circulated by a cooling distribution unit (CDU) 131 of the electronics rack. A pump 134, which can be integrated with or external to the CDU, can circulate the rack-fluid to server components, for example, through a manifold 132 or other liquid-line infrastructure. The rack-liquid (or rack-fluid) can be circulated to and from one or more liquid cooling devices 119 (e.g., cold plate, cold rails, or other liquid cooling devices) of the rack and the liquid-to-liquid heat exchanger to absorb thermal energy from server 118.

Drawing attention to the liquid-to-liquid heat exchanger 102, the rack-liquid channel 104 is fluidly isolated from the external-liquid channel 106, however, the two channels are thermally coupled to each other (e.g., through physical contact, sharing a same cooling plate, etc.) to transfer thermal energy between rack-liquid that circulates through the rack-liquid channel and external-liquid that circulates through the first external-liquid channel. External-liquid can be provided and circulated by external cooling unit 120.

A liquid-to-air heat exchanger 108 has an air path 110 that circulates air between the electronics rack and ambient space around the electronics rack in the IT environment, the air path being thermally coupled to an external-liquid channel 112 to transfer thermal energy between the air and the external-liquid in the external-liquid channel. For example, an air-cooled electronic component 116 can have a fan 117 that draws air from ambient space through the component to cool it. Hot air can enter a hot air compartment behind the rack, where, in some embodiments, the heat exchangers create a barrier to compartmentalize the hot air and trap it so that it can be cooled through the liquid-to-air heat exchanger. A fan 114 can draw air through the air path of the air-to-liquid heat exchanger where the hot air is cooled. The fan can be outside of the hot air compartment as shown (thereby pulling air through the air path) or inside the hot air compartment (where it would push the hot air through the air path).

Different fan configurations and positions are possible. In some cases, only the electronic components have fans while the liquid-to-air heat exchanger (or plurality of such heat exchangers) do not. For example, in one embodiment, the liquid-to-air heat exchanger does not have a fan 114 and is a fan-less heat exchanger. In other cases, only the liquid-to-air heat exchangers have fans while the rack components do not have fans. For example, the electronic component 116 can be fan-less. In some cases, there are no fans, and in other cases the heat exchangers and the rack components have fans. It should be understood that the air path and liquid channels shown in the drawings are simplified drawings that represent physical features that can vary from those shown. For example, in one embodiment, an air path of a liquid-to-air heat exchanger has a path straight from a bottom portion or bottom surface to a top portion or top surface.

The cooling system shown in FIG. 1 uses the liquid-to-air heat exchanger to manage the temperature of the IT environment. This can prevent the air temperature from rising to a point that exceeds requirements of the air-cooled components. Further, the heat load requirements of the liquid-cooled components are also satisfied through the liquid-to-liquid heat exchanger.

It should be understood that, although shown in FIG. 1 as a single liquid-to-liquid heat exchanger, the system can include one or more liquid-to-liquid heat exchangers, each having respective rack-liquid channels and external-liquid channels. Similarly, the system can include one or more liquid-to-air heat exchangers, each having respective air paths and external-liquid channels.

In one embodiment, the liquid-to-liquid heat exchanger and the liquid-to-air heat exchanger are separate bodies that are physically coupled together (e.g., fixed together when assembled onto the rack system). In another embodiment, the liquid-to-liquid heat exchanger and the liquid-to-air heat exchanger are separate sections of a same housing. They can be formed in the same housing that is partitioned to have a one or more liquid-to-liquid sections and one or more liquid-to-air sections.

In one embodiment, one or more external cooling units can connect to the external-liquid channels of the heat exchangers to cool and/or circulate the external liquid. For example, an external cooling unit 120 can have a pump 122 that circulates all external-liquid. A supply line of the external cooling unit connects to an inlet of the liquid-to-air heat exchanger and/or an inlet of the liquid-to-liquid heat exchanger. Similarly, a return line of the external cooling unit connects to an outlet of the liquid-to-air heat exchanger, and/or an outlet of the liquid-to-liquid heat exchanger.

In one embodiment, the liquid-to-liquid heat exchanger 102 is used as a condenser, while the electronics rack uses thermosiphon technology for the 'internal' or rack-coolant loop. In such a case, a cold plate 119 of the electronics rack vaporizes the rack-liquid and the vaporized liquid travels through lines 132 based on natural forces (e.g., gravity and pressure equilibrium) to the liquid-to-liquid heat exchanger. The liquid-to-liquid heat exchanger condenses the vaporized rack-liquid (by extracting thermal energy from the vapor and converting the coolant back to liquid), and the natural forces cause the condensed rack-liquid to travel back towards the cold plate. Beneficially, the electronics rack, in this case, does not rely on pump 134 to circulate rack-coolant, and the pump can be removed, providing a robust and efficient solution. It should be understood that 'external-liquid' and 'rack-liquid' is used interchangeably with 'external-coolant' and 'rack-coolant' since, as mentioned above, the liquid can in some cases be vapor. As mentioned, the pump 134 can be packaged within the CDU, outside the CDU, or eliminated (e.g., by using thermosiphon features).

Figure 4:
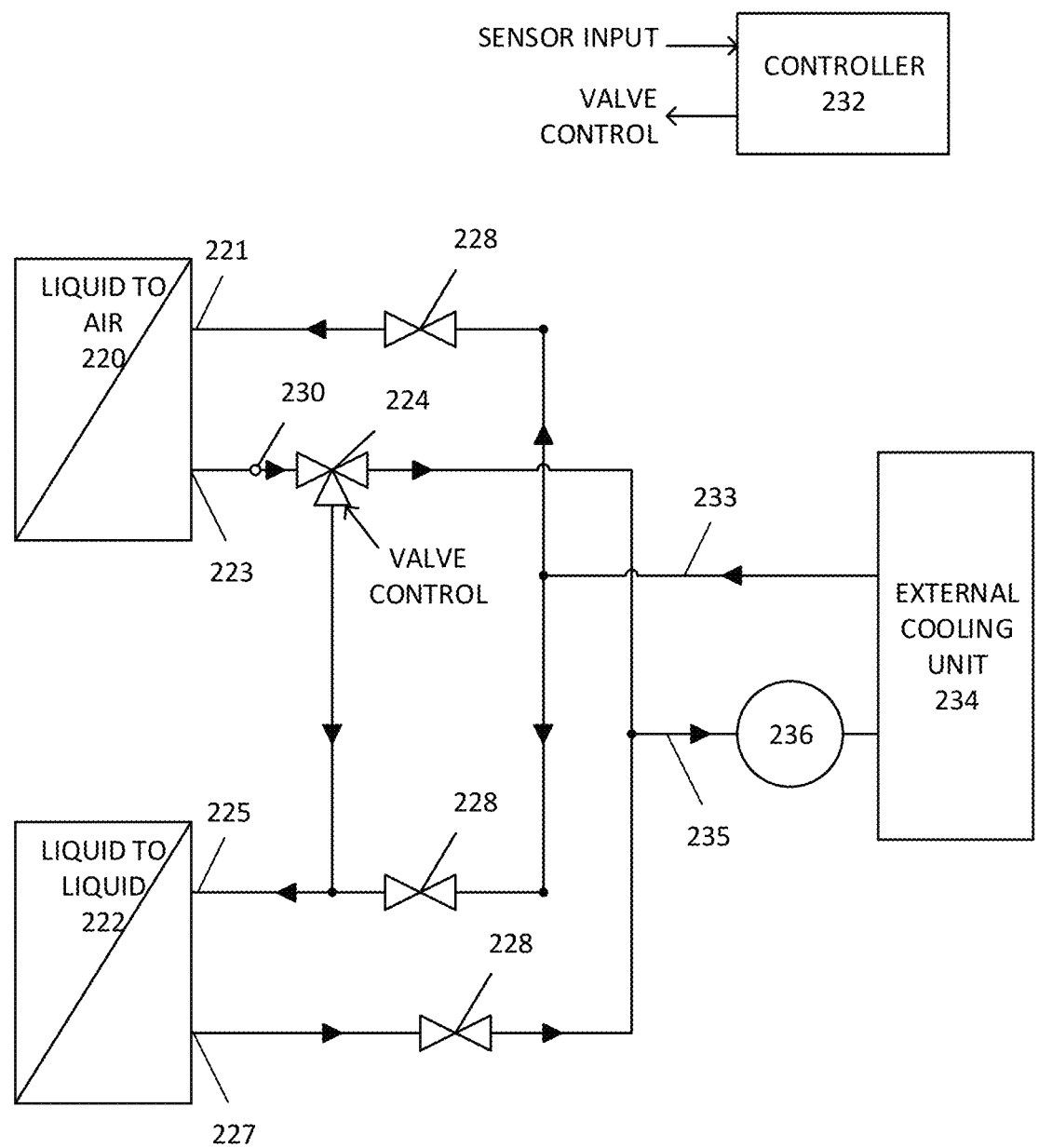
FIG. 4 shows a cooling system for electronics racks with a bypass external cooling input, according to one embodiment.
Figure 5:
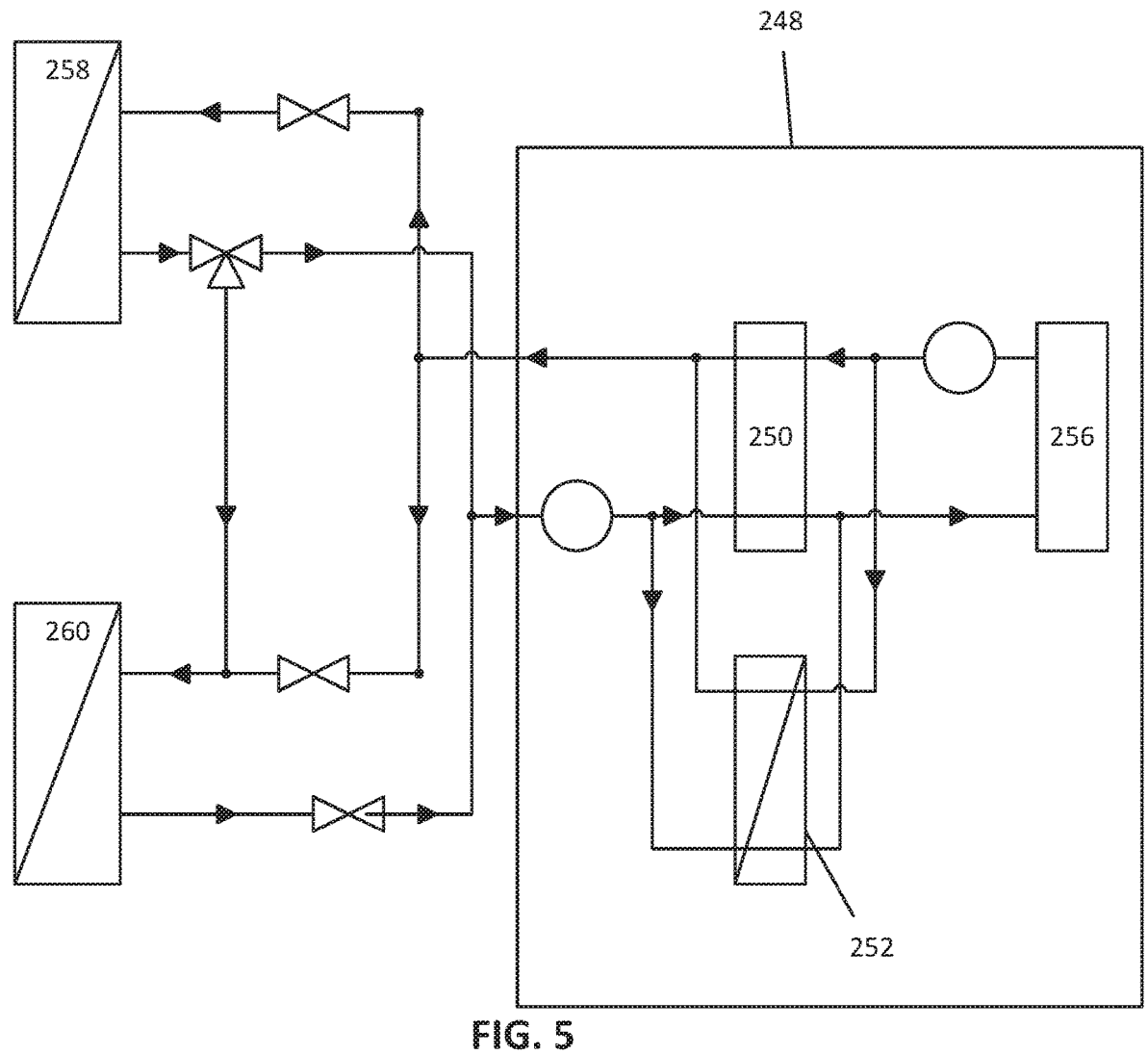
FIG. 5 shows a cooling system with an external cooling unit, according to one embodiment.

Although the external-liquid channels are shown as being independently connected to external cooling unit 120, it should be understood that the external-liquid supply from the external cooling unit to the heat exchangers can have a different configuration. In one embodiment, an outlet of second external-liquid channel of the liquid-to-air heat exchanger connects to an inlet of the first external-liquid channel of the liquid-to-liquid heat exchanger. See, for example, the dotted line connecting the external return line of the liquid-to-air heat exchanger to the external supply line of the liquid-to-liquid heat exchanger in FIG. 1. Other examples are shown in FIGS. 4 and 5 and discussed in other sections. In this case, the warmed up external liquid that absorbed thermal energy from the air can be directed to and used by the liquid-to-liquid heat exchanger to further absorb thermal energy from rack liquid. This takes advantage of differing requirements and thermal properties of air-cooled and liquid-cooled systems—the liquid that is used to cool the air in liquid-to-air heat exchanger 108 may still be sufficiently cool to use in a liquid-to-liquid cooled system. Thus the system can improve efficiency here by reusing external-liquid that has been warmed via air-cooling but is still sufficient for liquid-to-liquid cooling.

Figure 2:
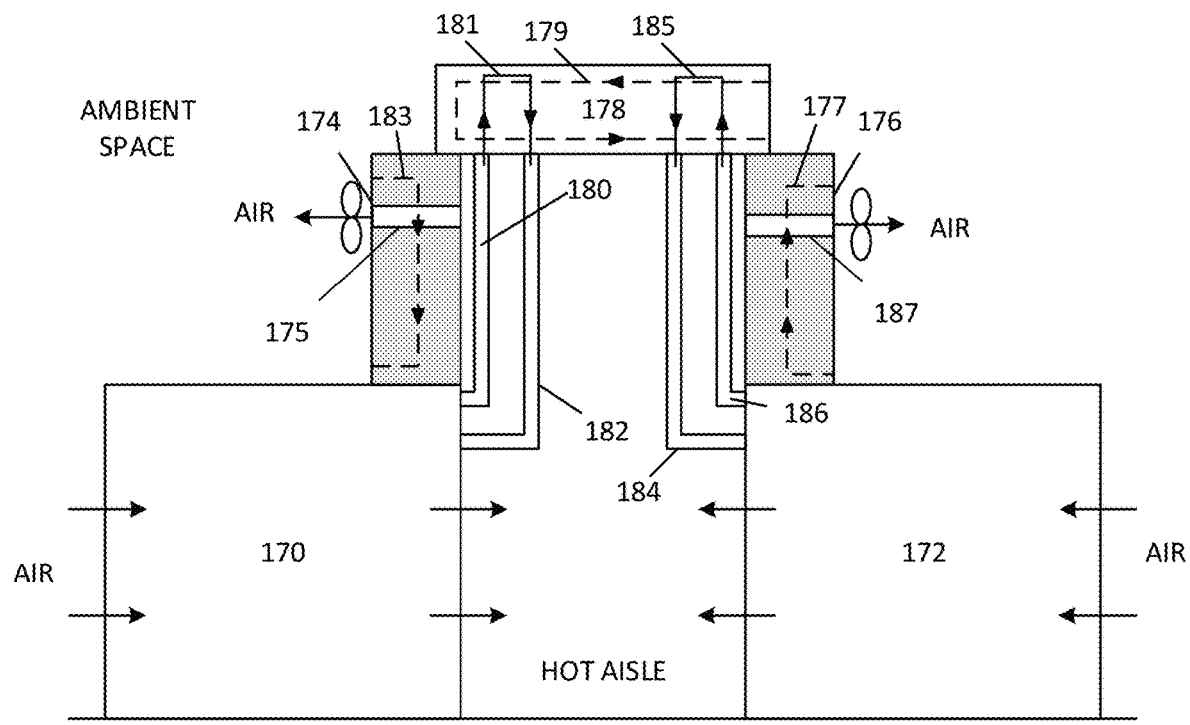
FIG. 2 shows a cooling system for electronics racks, according to one embodiment.

A cooling system is shown in FIG. 2 according to one embodiment, where the cooling system has one liquid-to-liquid heat exchanger that cools rack-liquid for two or more electronics racks and two liquid-to-air heat exchangers that work together to cool hot air from two or more electronics racks. The cooling system includes a liquid-to-liquid heat exchanger 178 having a rack-liquid channel 181, and a first external liquid channel 179, the rack-liquid channel 181 and the first external-liquid channel 179 being a) fluidly isolated from each other and b) thermally coupled to each other to transfer thermal energy between rack-liquid that circulates through the rack-liquid channel and first external-liquid that circulates through the first external-liquid channel.

The liquid-to-liquid heat exchanger 178 has a second rack-liquid channel 185 that circulates rack-liquid to and from the second electronics rack 172 and is a) fluidly isolated from the rack-liquid channel of the electronics rack 178 and also isolated from the external-liquid channel 178, and b) thermally coupled to the first external-liquid channel to transfer thermal energy from the second electronics rack (through the rack-liquid) to the external-liquid. In one embodiment, rack-liquid channels 181 and 185 are also fluidly isolated.

In one embodiment, the liquid-to-liquid heat exchanger 178 has an external liquid channel and a rack-liquid channel that connects to each of the electronics racks, for example, through conduits 180, 182, 184 and 186 that travel from respective racks to the liquid-to-liquid heat exchanger. In this embodiment, the rack fluid is distributed from racks 170 and 172 through conduits 180 and 186 to channels 181 and 185, and returns to the racks through conduits 182 and 184, respectively.

A (first) liquid-to-air heat exchanger 174 has an air path 175 that circulates air between the electronics rack and ambient space around the electronics rack, the air path being thermally coupled to a second external-liquid channel 183 to transfer thermal energy between the air and the second external-liquid.

A second liquid-to-air heat exchanger 176 has a third external-liquid channel 177 and a second air path 187 that circulates the air between a) the electronics rack and a second electronics rack, and b) the ambient space, the second air path being thermally coupled to the third external-liquid channel 177 to cool the air and transfer thermal energy between the air and the external-liquid in the channel.

In other words, the first liquid-to-air heat exchanger and the second liquid-to-air heat exchanger each have a respective external-liquid channel and an air path that circulates air between the electronics racks and ambient space around the electronics racks, the air path being thermally coupled to the respective external-liquid channel to transfer thermal energy between the air and external-liquid that circulates through the respective external-liquid channel. Although not shown, each of the external-liquid channels connects to an external cooling unit that circulates the external-liquid through each of the external-liquid channels.

In one embodiment, the liquid-to-liquid heat exchanger 178 is located between and adjacent to the liquid-to-air heat exchanger 174 and the second liquid-to-air heat exchanger 177. The air circulates from ambient space, through the electronics rack and the second electronics rack, to a hot aisle air section located between the electronics racks 170 and 172. The heat exchangers can, in one embodiment, form a barrier to trap the hot air in the hot aisle, where most of the hot air must pass through the air paths of the liquid-to-air heat exchangers, thereby cooling the air, and circulating the air back to ambient space.

Figure 9:
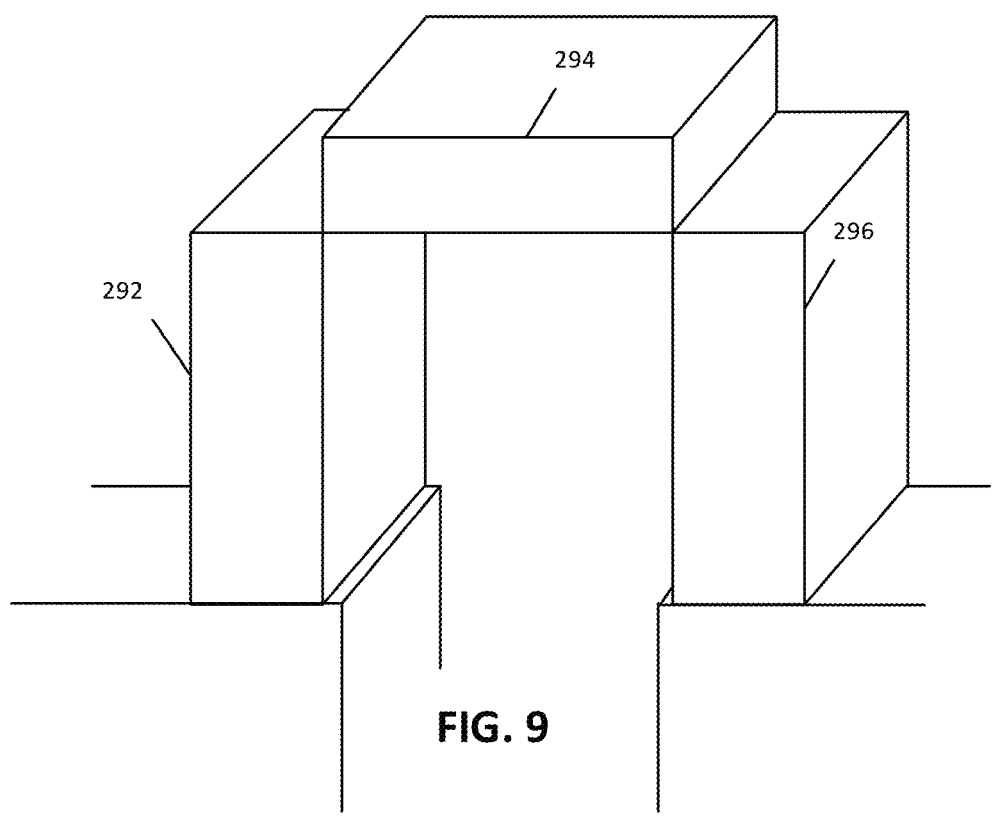
FIG. 9 show heat exchangers forming a table shape, according to one embodiment.

In one embodiment, the liquid-to-liquid heat exchanger 178, the first liquid-to-air heat exchanger 174, and the second liquid-to-air heat exchanger 177 are connected to form a table-shaped barrier between the ambient space and a hot aisle air section between the electronics racks. Referring to FIG. 9, the table-shaped barrier has a top portion 294 formed by the liquid-to-liquid heat exchanger, a first side wall 292 formed by the first liquid-to-air heat exchanger, and a second side wall formed 296 by the second liquid-to-air heat exchanger. By forming such a barrier, the air circulates from the electronics racks through the hot aisle air section to the air path of the first liquid-to-air heat exchanger and the air path of the second liquid-to-air heat exchanger to the ambient space, and back to the electronics racks. This maintains a suitable air temperature in the IT environment.

Figure 3:
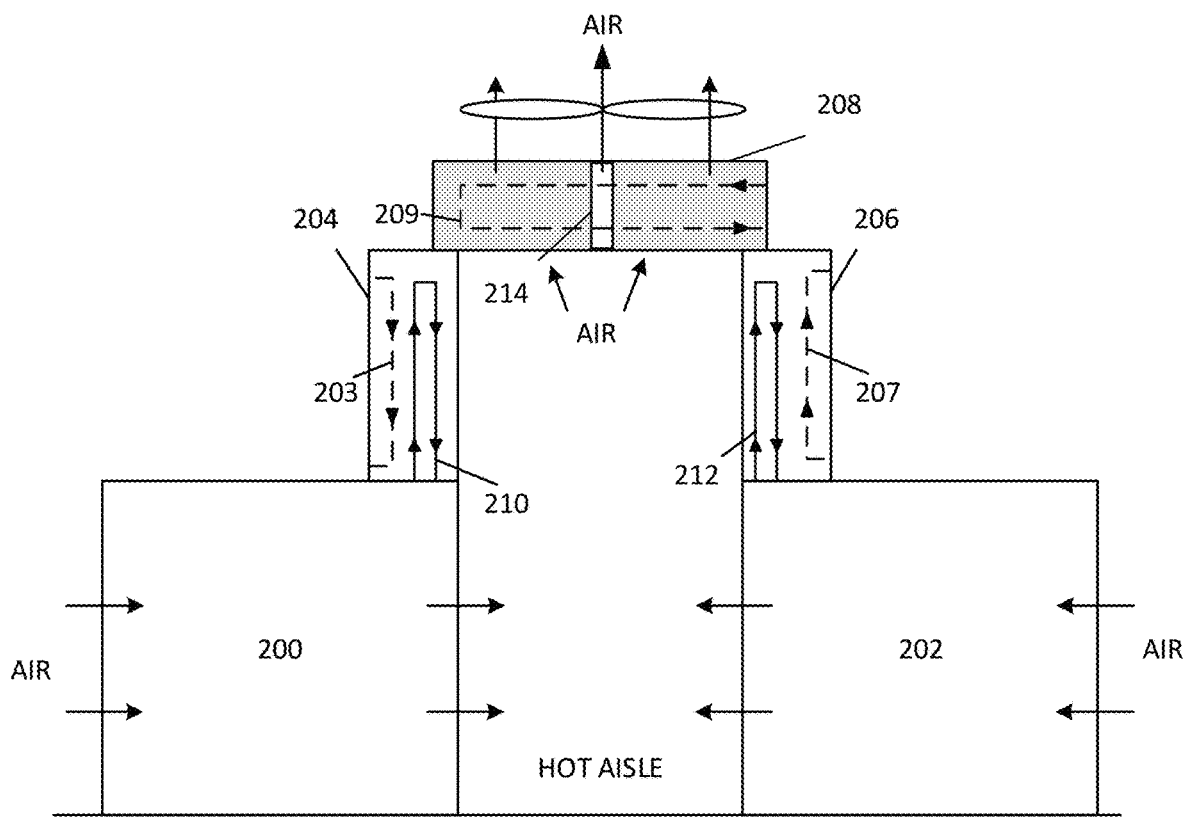
FIG. 3 shows a cooling system for electronics racks, according to one embodiment.

A cooling system according to one embodiment is shown in FIG. 3. The cooling system includes a liquid-to-air heat exchanger 208, a first liquid-to-liquid heat exchanger 204 and a second liquid-to-liquid heat exchanger 206. The heat exchangers work together to provide cooling for a plurality of electronics racks (e.g., racks 200 and 202).

A (first) liquid-to-liquid heat exchanger has a rack-liquid channel 210, and a first external liquid channel 203, the rack-liquid channel and the first external-liquid channel being a) fluidly isolated from each other and b) thermally coupled to each other to transfer thermal energy between rack-liquid that circulates through the rack-liquid channel and first external-liquid that circulates through the first external-liquid channel.

A second liquid-to-liquid heat exchanger 206 has a second rack-liquid channel 212, and a third external liquid channel 207, the second rack-liquid channel and the third external-liquid channel being a) fluidly isolated from each other and b) thermally coupled to each other to transfer thermal energy between second rack-liquid and the third external-liquid.

In other words, the cooling system can have a first liquid-to-liquid heat exchanger 204 and a second liquid-to-liquid heat exchanger 206, each having a respective rack-liquid channel 203 and 207, and a respective external-liquid channel 210 and 212, where the respective rack-liquid channel and the respective external-liquid channel are a) fluidly isolated from each other, and b) thermally coupled to each other.

A liquid-to-air heat exchanger 208 has an air path 214 that provides for air to circulate air between a) the electronics racks 200 and 202, and b) ambient space around the electronics rack. The air path is thermally coupled to a second external-liquid channel 209 to transfer thermal energy between the air and coolant in the second external-liquid channel. It should be understood that the air path can, in some embodiments, include one or more paths, although shown in the different drawings as a single path to reduce clutter.

Although not shown in the FIG. 3 to reduce clutter, the rack-liquid channel of the first liquid-to-liquid heat exchanger 204 connects to a rack-liquid channel of the electronics rack 200 that circulates liquid that is thermally coupled to one or more electronics components of the electronics rack. Similarly, the second rack-liquid channel of the second liquid-to-liquid heat exchanger 206 connects to a rack-liquid channel of a second electronics rack 202 that circulates liquid that is thermally coupled to one or more electronics components of the second electronics rack. Similarly, each of the external-liquid channels of the heat exchangers connects to an external cooling unit that circulates the external-liquid through each of the external-liquid channels.

In one embodiment, the liquid-to-air heat exchanger 208 is located between and adjacent to the first and second liquid-to-liquid heat exchangers. Air circulates from the electronics racks through a hot aisle air section to the air path 214 of the liquid-to-air heat exchanger. The heat exchangers can be joined so that they form a barrier between ambient space and the hot aisle air section. Hot air is trapped and is funneled through the liquid-to-air heat exchanger to efficiently control air temperature in the IT environment.

In one embodiment, the liquid-to-air heat exchanger, the first liquid-to-liquid heat exchanger, and the second liquid-to-liquid heat exchanger are coupled together to form a table-shaped barrier (see FIG. 3 and FIG. 9) between the ambient space and a hot aisle air section between the electronics racks. The table-shaped barrier has a top portion 294 formed by the liquid-to-air heat exchanger 208, a first side wall 292 formed by the first liquid-to-liquid heat exchanger 204, and a second side wall 296 formed by the second liquid-to-liquid heat exchanger 206. The air circulates from the electronics racks through the hot aisle air section to the air path of the liquid-to-air heat exchanger to the ambient space and back to the electronics racks. Further, hot air rises (in the hot aisle) naturally towards the top portion formed by the liquid-to-air heat exchanger, where it is drawn through the air patch, cooling the hot air, and circulated back to ambient space in an efficient manner. When these three heat exchangers are coupled, the 203, 207 as well as 209 in FIG. 3 can be designed to connect to one single fluid source. Detailed fluid loop design will be explained in following sections.

FIG. 4 shows a cooling system according to one embodiment. An external cooling unit 234 has a supply line 233 that connects to an inlet 221 of the liquid-to-air heat exchanger and/or an inlet 225 of the liquid-to-liquid heat exchanger 222, and a return line 235 that connects to an outlet 223 of the liquid-to-air heat exchanger, and/or an outlet 227 of the liquid-to-liquid heat exchanger. It should be understood that the 'inlet' and 'outlet' of the heat exchangers lead to the respective external-liquid channels that are not shown in the figure. Further, a single heat exchanger can have multiple external-cooling loops or channels, such configurations can be determined through test and repetition.

In one embodiment, external-liquid lines between the external cooling unit and the heat exchangers can have one or more check valves 228 that prevent flow of liquid in unintended directions.

In one embodiment, the outlet 223 of the liquid-to-air heat exchanger also connects to the inlet 225 of the liquid-to-liquid heat exchanger 222, as shown in FIG. 4. The one or more valves 224 (e.g., a three-way valve) controls and directs liquid flow from the outlet of the liquid-to-air heat exchanger and the supply line to the inlet of the liquid-to-liquid heat exchanger. In one embodiment, a cooling system controller 232 is configured to control the liquid flow between the outlet of the liquid-to-air heat exchanger and the inlet of the liquid-to-liquid heat exchanger, which can bypass and/or offset the amount of liquid supplied to the liquid-to-liquid heat exchanger directly from the external cooling unit. The liquid flow can be controlled based on a temperature of the external-liquid that exits the outlet of the liquid-to-air heat exchanger, which can be sensed by one or more temperature sensors 230, and a threshold external-liquid temperature. It should be understood that the liquid flow will be also controlled based on actual thermal requirements of the IT equipment as well as the actual IT operating conditions. The threshold temperature can be based on a max temperature that can enter the inlet of the liquid-to-liquid heat exchanger, which can be determined based on thermal requirements and/or power density of electronics racks and components thereof. An optimal threshold temperature can vary from one rack to another or from one system to another. In some cases, the operating scenario may also vary based on the external cooling unit used by the systems and ambient conditions.

In one embodiment, the one or more valves 224 can be electro-mechanical valves that are controlled by a valve control signal from the controller 232. In one embodiment, the controller can be integrated in as part of the external cooling unit or as part of a system on the electronics rack. The controller 232 can have a processor that executes instructions stored in memory, where the instructions include a control algorithm that processes the sensed temperature from sensor 230 and generates a valve control output used to control a valve position of valve 224.

In one embodiment, the temperature sensors and controls can be integrated into the valve 224 (e.g., a smart valve). In one embodiment, the controller 232 can be formed from one or more analog, integrated circuits, and/or digital circuits, for example, using a combination of active and passive electronic components. Electronic circuits that modify a control signal (e.g., a valve position) based on a sensor reading (e.g., temperature) are known.

In one embodiment, when the temperature is sensed to be below the threshold, flow of liquid from outlet of the liquid-to-air heat exchanger to the inlet of the liquid-to-liquid heat exchanger can be increased, while flow from external cooling unit to the liquid-to-liquid heat exchanger is reduced or bypassed completely. As the temperature gets closer to the threshold, liquid flow from the external cooling unit can be increased while the flow from the liquid-to-air heat exchanger to the liquid-to-liquid heat exchanger is reduced. If the temperature threshold is satisfied or exceeded, then the valve position can be controlled to significantly reduce or bypass flow from the liquid-to-air heat exchanger to the liquid-to-liquid heat exchanger. In such a case, all or most of the fluid flow to the liquid-to-liquid heat exchanger will come from the external cooling unit. A pump 236 or other circulation means can be used to circulate the external-liquid between the external cooling unit, the liquid-to-liquid heat exchanger, and the liquid-to-air heat exchanger.

In one embodiment, as shown in FIG. 5, an external cooling unit 248 includes a cooling tower 256 that serves as a reservoir for external-liquid. A chiller 250 can be used to cool the external liquid. The chiller can use known refrigeration vapor-compression technology to cool the external liquid. Additionally or alternatively, a plate heat exchanger 252 can be used to cool the external-liquid. The plate heat exchanger use passive cooling such as air cooling or liquid cooling. A cooling plate can have fins that help transfer thermal energy from the external cooling liquid to an external fluid (e.g., air or water).

The plate heat exchanger can be especially efficient and cost-effective where the data center has access to cool air or water (e.g., it is in a cold climate or near a river or sea). The cooling plate can have one or more surfaces that come in contact with external fluid such as cold ambient air, sea water, river water, etc. The external cooling unit provides temperature managed coolant to one or more liquid-to-air heat exchangers 258 and one or more liquid-to-liquid heat exchangers 260.

It should be understood that mechanical features of heat exchangers can be implemented differently. For example, a liquid-to-liquid heat exchanger can include a cold plate where the rack-liquid channel and the external-liquid channel formed within the cold plate. The cold plate can thermally couple the two channels, and thermal energy can transfer through the cold plate. Cold plates can be formed from different suitable materials, preferably with low thermal resistance.

Figure 6:
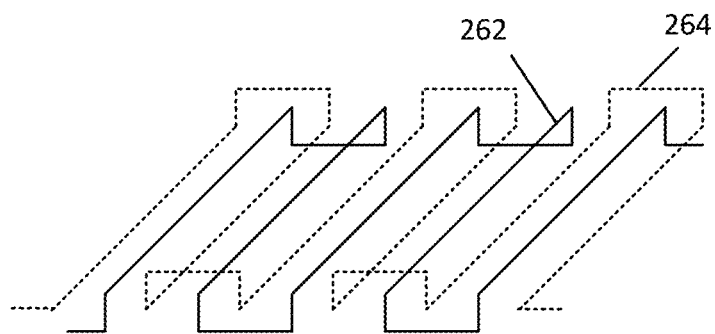
FIGS. 6-7 show examples of coolant channels and air paths, according to embodiments.
Figure 7:
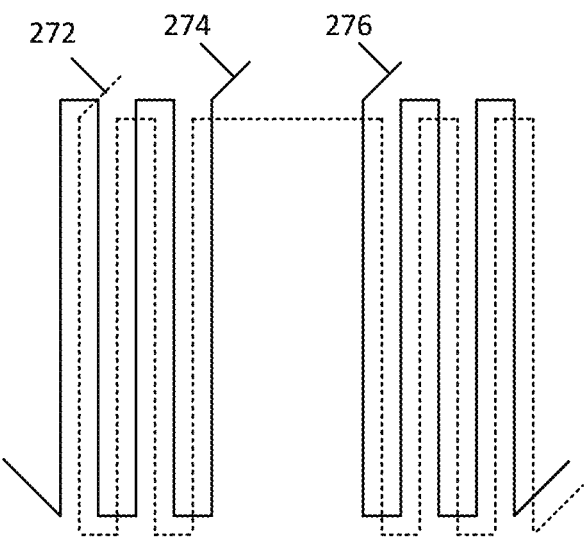
Figure 8:
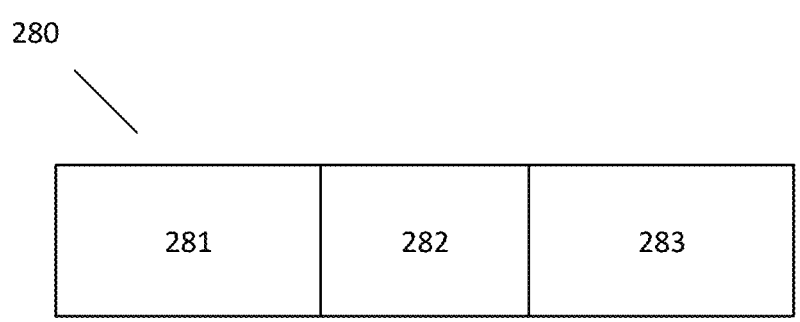
FIG. 8 shows a multi-function heat exchanger, according to one embodiment.

As mentioned, 'liquid channel' and 'air path' can take various shapes and configurations based on application constraints (e.g., sizing, power dissipation, cost, etc.). The channels can be zig-zagging, coiling (e.g., a spiral-shape), interlocking, and/or interweaving. Other channel designs can be used. A liquid-to-air heat exchanger can have a cross flow feature. In a crossflow liquid-to-air heat exchanger, the air path is straight from one side to other side, the liquid channel can be either a single circuit channel or have a zig-zagging geometry. For a liquid-to-liquid heat exchanger, a common design in this application is a counter flow heat exchanger. For example, FIG. 6 illustrates a rack-coolant channel 262 and an external-liquid channel 264 having interweaving and zig-zagging paths to transfer thermal energy. These paths or channels can be formed as conduit/piping, or carved out of a solid plate, or formed from a mold, or other known manufacturing techniques. FIG. 7 shows an example where a heat exchanger can have an external-liquid channel 272 and a plurality of rack-coolant channels 274 and 276. In one embodiment, it is possible to use standard liquid-to-liquid and liquid-to-air heat exchangers and make necessary thermal and fluid connections among them. In another embodiment, as illustrated in FIG. 8, one or more liquid-to-liquid heat exchangers and one or more liquid-to-air heat exchangers can be integrated as a single device 280 (e.g., sharing a same housing and/or a same primary loop that circulates external-fluid) with different portions 281, 282, and 283 being allocated for any of the one or more liquid-to-liquid portions and/or one or more liquid-to-air portions.

In one embodiment, as discussed in other sections, the heat exchangers can form a table-shape as shown in FIG. 9, where a first heat exchanger forms a first side wall 292, a second heat exchanger forms a top portion 294, and a third heat exchanger forms a third side wall 296. The heat exchangers can create a barrier that separates hot air (from the electronics rack) and ambient space in the IT environment. The hot air is then forced to circulate back to the ambient space through an air path of a liquid-to-air heat exchanger, where the hot air is cooled.

Note that a server, as used in this disclosure, is interchangeable any information technology (IT) component or element that when operates, generates heat. A server can include a processor, a field programmable gate array (FPGA), an application specific integrated circuit (ASIC), or any computing components. One or more servers can be placed in an electronic rack of a data center. A server may be contained within a server blade which is inserted into one of the server slots of an electronic rack. Each server includes a processor, a memory, a storage device, and a network interface that are configured to provide data processing services to clients. Such components may generate heat during normal operations. Also note that condensers (or heat exchangers) of the components can each include a cooling member which can be a cold plate using liquid cooling, in which liquid-to-liquid heat exchange is performed using a rack cooling unit, a room cooling unit, and/or a datacenter cooling unit.

Figure 10:
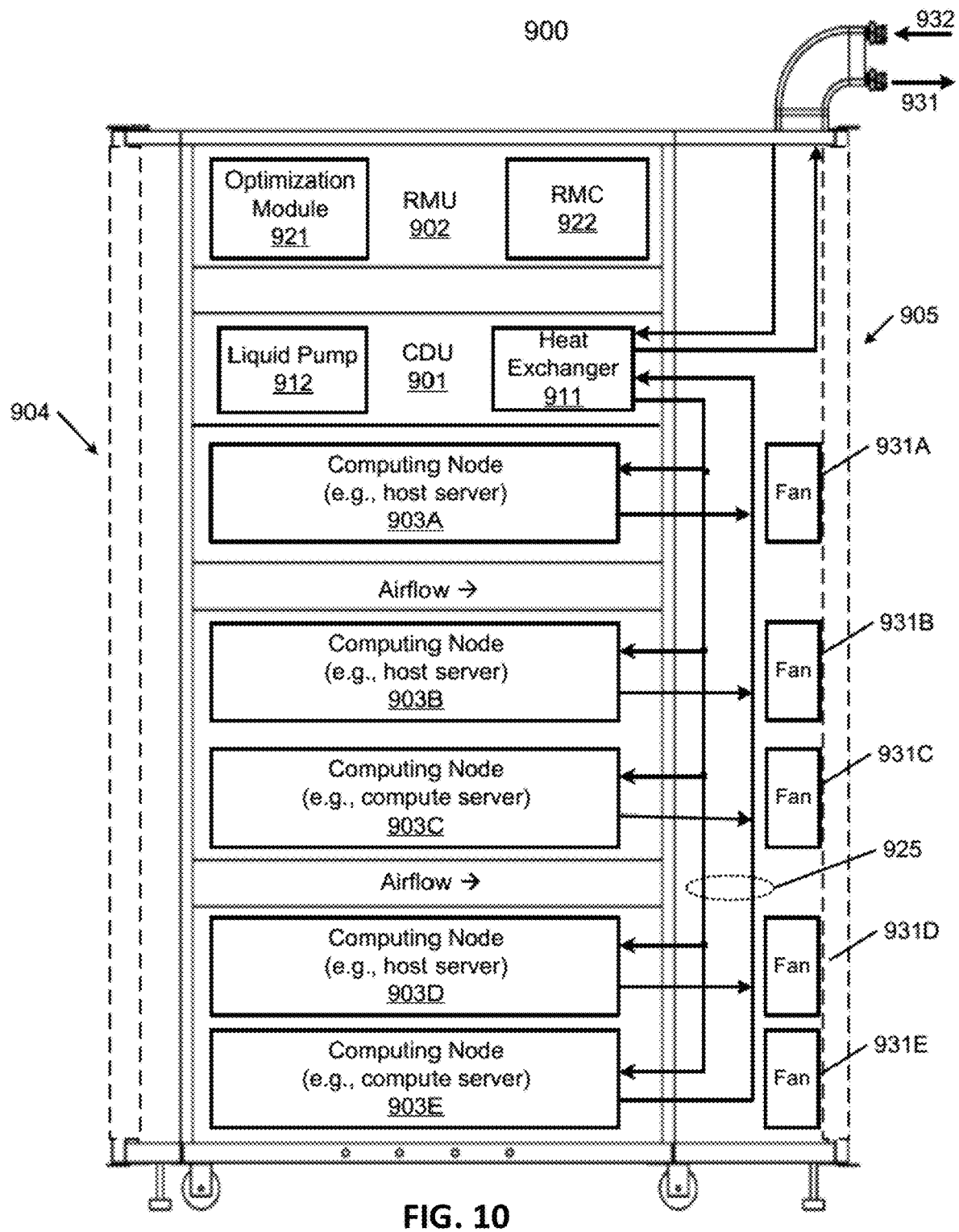
FIG. 10 shows an electronic shelf rack, according to one embodiment.

FIG. 10 is a block diagram illustrating an example of an electronic rack according to one embodiment. Electronic rack 900 may contain one or more servers, each server having one or more processing units attached to a bottom of any of the cooling devices described above. Referring to FIG. 10, according to one embodiment, electronic rack 900 includes, but is not limited to, CDU 901, rack management unit (RMU) 902 (optional), and one or more server blades 903A-903D (collectively referred to as server blades 903). Server blades 903 can be inserted into an array of server slots respectively from frontend 904 or backend 905 of electronic rack 900. Note that although there are only five server blades 903A-903E shown here, more or fewer server blades may be maintained within electronic rack 900. Also note that the particular positions of CDU 901, RMU 902, and server blades 903 are shown for the purpose of illustration only; other arrangements or configurations of CDU 901, RMU 902, and server blades 903 may also be implemented. Note that electronic rack 900 can be either open to the environment or partially contained by a rack container, as long as the cooling fans can generate airflows from the frontend to the backend.

In addition, for each of the server blades 903, a fan module is associated with the server blade. In this embodiment, fan modules 931A-931E, collectively referred to as fan modules 931, and are associated with server blades 903A-903E respectively. Each of the fan modules 931 includes one or more cooling fans. Fan modules 931 may be mounted on the backends of server blades 903 to generate airflows flowing from frontend 904, traveling through the air space of the sever blades 903, and existing at backend 905 of electronic rack 900.

In one embodiment, CDU 901 mainly includes heat exchanger 911, liquid pump 912, and a pump controller (not shown), and some other components such as a liquid reservoir, a power supply, monitoring sensors and so on. Heat exchanger 911 may be a liquid-to-liquid heat exchanger. Heat exchanger 911 includes a first loop with inlet and outlet ports having a first pair of liquid connectors coupled to external liquid supply/return lines 931-932 to form a primary loop. The connectors coupled to the external liquid supply/return lines 931-932 may be disposed or mounted on backend 905 of electronic rack 900. The liquid supply/return lines 931-932 are coupled to a set of room manifolds, which are coupled to an external heat removal system, or extremal cooling loop. In addition, heat exchanger 911 further includes a second loop with two ports having a second pair of liquid connectors coupled to liquid manifold 925 to form a secondary loop, which may include a supply manifold to supply cooling liquid to server blades 903 and a return manifold to return warmer liquid back to CDU 901. Note that CDUs 901 can be any kind of CDUs commercially available or customized ones. Thus, the details of CDUs 901 will not be described herein. As an example, cooling device 108 shown in FIG. 7 may connect to 925 to complete a full fluid loop.

Each of server blades 903 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices as described above. Server blades 903 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 900 further includes optional RMU 902 configured to provide and manage power supplied to servers 903, fan modules 931, and CDU 901. RMU 902 may be coupled to a power supply unit (not shown) to manage the power consumption of the power supply unit. The power supply unit may include the necessary circuitry (e.g., an alternating current (AC) to direct current (DC) or DC to DC power converter, backup battery, transformer, or regulator, etc.) to provide power to the rest of the components of electronic rack 900.

In one embodiment, RMU 902 includes optimization module 921 and rack management controller (RMC) 922. RMC 922 may include a monitor to monitor operating status of various components within electronic rack 900, such as, for example, computing nodes 903, CDU 901, and fan modules 931. Specifically, the monitor receives operating data from various sensors representing the operating environments of electronic rack 900. For example, the monitor may receive operating data representing temperatures of the processors, cooling liquid, and airflows, which may be captured and collected via various temperature sensors. The monitor may also receive data representing the fan power and pump power generated by the fan modules 931 and liquid pump 912, which may be proportional to their respective speeds. These operating data are referred to as real-time operating data. Note that the monitor may be implemented as a separate module within RMU 902.

Based on the operating data, optimization module 921 performs an optimization using a predetermined optimization function or optimization model to derive a set of optimal fan speeds for fan modules 931 and an optimal pump speed for liquid pump 912, such that the total power consumption of liquid pump 912 and fan modules 931 reaches minimum, while the operating data associated with liquid pump 912 and cooling fans of fan modules 931 are within their respective designed specifications. Once the optimal pump speed and optimal fan speeds have been determined, RMC 922 configures liquid pump 912 and cooling fans of fan modules 931 based on the optimal pump speed and fan speeds.

As an example, based on the optimal pump speed, RMC 922 communicates with a pump controller of CDU 901 to control the speed of liquid pump 912, which in turn controls a liquid flow rate of cooling liquid supplied to the liquid manifold 925 to be distributed to at least some of server blades 903. Therefore, the operating condition and the corresponding cooling device performance is adjusted. Similarly, based on the optimal fan speeds, RMC 922 communicates with each of the fan modules 931 to control the speed of each cooling fan of the fan modules 931, which in turn control the airflow rates of the fan modules 931. Note that each of fan modules 931 may be individually controlled with its specific optimal fan speed, and different fan modules and/or different cooling fans within the same fan module may have different optimal fan speeds.

Note that some or all of the IT components of servers 903 may be attached to any one of the cooling devices described above, either via air cooling using a heatsink or via liquid cooling using a cold plate. One server may utilize air cooling while another server may utilize liquid cooling. Alternatively, one IT component of a server may utilize air cooling while another IT component of the same server may utilize liquid cooling.

It should be understood that the various features shown with respect to one figure can also be present in other embodiments of different feature.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling system for an electronics rack, comprising:
   a liquid-to-liquid heat exchanger having a rack-liquid channel, and a first external liquid channel, the rack-liquid channel and the first external-liquid channel being a) fluidly isolated from each other and b) thermally coupled to each other to transfer thermal energy between rack-liquid that circulates through the rack-liquid channel and external-liquid that circulates through the first external-liquid channel; and
   a liquid-to-air heat exchanger having an air path that circulates air from a hot aisle air section that traps hot air received from the electronics rack, to ambient space around the electronics rack, the air path being thermally coupled to a second external-liquid channel to transfer thermal energy between the air and external-liquid that circulates through the second external-liquid channel.

2. The cooling system of claim 1, wherein an outlet of the second external-liquid channel of the liquid-to-air heat exchanger connects to an inlet of the first external-liquid channel of the liquid-to-liquid heat exchanger to circulate external-liquid from the liquid-to-air heat exchanger to the liquid-to-liquid heat exchanger.

3. The cooling system of claim 1, further comprising a second liquid-to-liquid heat exchanger having a second rack-liquid channel, and a third external liquid channel, the second rack-liquid channel and the third external-liquid channel being a) fluidly isolated from each other and b) thermally coupled to each other to transfer thermal energy between second rack-liquid and external-liquid in the third external-liquid channel;
   wherein
      the rack-liquid channel of the liquid-to-liquid heat exchanger connects to a rack-liquid channel of the electronics rack that circulates liquid that is thermally coupled to one or more electronics components of the electronics rack, and
      the second rack-liquid channel of the second liquid-to-liquid heat exchanger connects to a rack-liquid channel of a second electronics rack that circulates liquid that is thermally coupled to one or more electronics components of the second electronics rack.

4. The cooling system of claim 3, wherein
   the liquid-to-air heat exchanger is located between and adjacent to the liquid-to-liquid heat exchanger and the second liquid-to-liquid heat exchanger, the air circulating from the electronics rack and the second electronics rack through the hot aisle air section to the air path of the liquid-to-air heat exchanger, and
   the liquid-to-air heat exchanger, the liquid-to-liquid heat exchanger, and the second liquid-to-liquid heat exchanger forms a barrier between the ambient space and the hot aisle air section.

5. The cooling system of claim 1, further comprising a second liquid-to-air heat exchanger having a third external-liquid channel and a second air path that circulates the air between a) the electronics rack and a second electronics rack, and b) the ambient space, the second air path being thermally coupled to the third external-liquid channel to transfer thermal energy between the air and the external-liquid in the third external-liquid channel,
   wherein the liquid-to-liquid heat exchanger has a second rack-liquid channel that circulates rack-liquid from the second electronics rack and is a) fluidly isolated from the rack-liquid channel of the electronics rack and the external-liquid of the external-liquid channel, and b) thermally coupled to the first external-liquid channel.

6. The cooling system of claim 5, wherein the liquid-to-liquid heat exchanger is located between and adjacent to the liquid-to-air heat exchanger and the second liquid-to-air heat exchanger, the air circulating from the electronics rack and the second electronics rack through the hot aisle air section to the liquid-to-air heat exchanger and the second liquid-to-air heat exchanger.

7. The cooling system of claim 1, wherein the liquid-to-liquid heat exchanger and the liquid-to-air heat exchanger are separate bodies that are physically coupled together or separate sections of a same housing.

8. The cooling system of claim 1, further comprising an external cooling unit, the external cooling unit including
   a supply line that connects to a) an inlet of the liquid-to-air heat exchanger, or b) an inlet of the liquid-to-liquid heat exchanger; and
   a return line that connects to c) an outlet of the liquid-to-air heat exchanger, or b) an outlet of the liquid-to-liquid heat exchanger.

9. The cooling system of claim 8, wherein the outlet of the liquid-to-air heat exchanger also connects to the inlet of the liquid-to-liquid heat exchanger and a valve controls liquid flow from the outlet of the liquid-to-air heat exchanger and the supply line to the inlet of the liquid-to-liquid heat exchanger.

10. The cooling system of claim 9, wherein a cooling system controller is configured to control the liquid flow based on a temperature of the external-liquid that exits the liquid-to-air heat exchanger and a threshold external-liquid temperature that can enter the liquid-to-liquid heat exchanger.

11. The cooling system of claim 8, further comprising a pump to circulate the external-liquid between the external cooling unit, the liquid-to-liquid heat exchanger, and the liquid-to-air heat exchanger.

12. The cooling system of claim 8, wherein the external cooling unit includes a cooling tower, a chiller, and plate heat exchanger.

13. The cooling system of claim 8, wherein the electronics rack has a manifold and pump that circulates the rack-liquid to and from one or more rack cold plates and the liquid-to-liquid heat exchanger.

14. The cooling system of claim 8, wherein
   the electronics rack does not have a pump that circulates the rack-liquid,
   a cold plate of the electronics rack vaporizes the rack-liquid,
   the liquid-to-liquid heat exchanger condenses the vaporized rack-liquid, and
   natural forces cause the vaporized rack-liquid to travel towards the liquid-to-liquid heat exchanger and cause the rack-liquid in liquid form to travel towards the cold plate.

15. The cooling system of claim 1, further comprising a fan to circulate the air between the electronics rack and the ambient space.

16. The cooling system of claim 1, wherein
   the liquid-to-liquid heat exchanger includes a cold plate having the rack-liquid channel and the first external-liquid channel formed within the cold plate, the rack-liquid channel and the first external-liquid channel having interweaving paths to transfer thermal energy, and
   the liquid-to-air heat exchanger includes a cold plate having the second external-liquid channel and the air path within the cold plate.

17. A cooling system for electronics racks, comprising:
a first liquid-to-liquid heat exchanger and a second liquid-to-liquid heat exchanger, each having a rack-liquid channel, and an external-liquid channel, the rack-liquid channel and the external-liquid channel being a) fluidly isolated from each other, and b) thermally coupled to each other to transfer thermal energy between rack-liquid that circulates through the rack-liquid channel and external-liquid that circulates through the external-liquid channel; and
a liquid-to-air heat exchanger having an air path that circulates air between the electronics racks and ambient space around the electronics racks, the air path being thermally coupled to an external-liquid channel of the liquid-to-air heat exchanger to transfer thermal energy between the air and the external-liquid,
wherein each of the external-liquid channels connect to an external cooling unit that circulates the external-liquid through each of the external-liquid channels.

18. The cooling system of claim 17, wherein
the liquid-to-air heat exchanger, the first liquid-to-liquid heat exchanger, and the second liquid-to-liquid heat exchanger are coupled together to form a table-shaped barrier between the ambient space and a hot aisle air section between the electronics racks,
the table-shaped barrier having a top portion formed by the liquid-to-air heat exchanger, a first side wall formed by the first liquid-to-liquid heat exchanger, and a second side wall formed by the second liquid-to-liquid heat exchanger, and
the air circulates from the electronics racks through the hot aisle air section to the air path of the liquid-to-air heat exchanger to the ambient space and back to the electronics racks.

19. A cooling system for electronics racks, comprising:
a liquid-to-liquid heat exchanger having an external-liquid channel and a rack-liquid channel for each of the electronics racks, the rack-liquid channel and the external-liquid channel being a) fluidly isolated from each other and b) thermally coupled to each other to transfer thermal energy between rack-liquid that circulates through the rack-liquid channel and external-liquid that circulates through the external-liquid channel; and
a first liquid-to-air heat exchanger and a second liquid-to-air heat exchanger, each having a respective external-liquid channel and an air path that circulates air between the electronics racks and ambient space around the electronics racks, the air path being thermally coupled to the respective external-liquid channel to transfer thermal energy between the air and external-liquid that circulates through the respective external-liquid channel,
wherein each of the external-liquid channels connect to an external cooling unit that circulates the external-liquid through each of the external-liquid channels.

20. The cooling system of claim 19, wherein
the liquid-to-liquid heat exchanger, the first liquid-to-air heat exchanger, and the second liquid-to-air heat exchanger are connected to form a table-shaped barrier between the ambient space and a hot aisle air section between the electronics racks,
the table-shaped barrier having a top portion formed by the liquid-to-liquid heat exchanger, a first side wall formed by the first liquid-to-air heat exchanger, and a second side wall formed by the second liquid-to-air heat exchanger, and
the air circulates from the electronics racks through the hot aisle air section to the air path of the first liquid-to-air heat exchanger and the air path of the second liquid-to-air heat exchanger to the ambient space, and back to the electronics racks.

\* \* \* \* \*